(12) United States Patent
Takai

(10) Patent No.: US 11,142,219 B2
(45) Date of Patent: Oct. 12, 2021

(54) CEILING CONVEYANCE SYSTEM, AND RELAY CONVEYANCE APPARATUS AND CONVEYANCE METHOD USED THEREFOR

(71) Applicant: MURATA MACHINERY, LTD., Kyoto (JP)

(72) Inventor: Kaname Takai, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 89 days.

(21) Appl. No.: 16/340,418

(22) PCT Filed: Oct. 6, 2017

(86) PCT No.: PCT/JP2017/036443
§ 371 (c)(1),
(2) Date: Apr. 9, 2019

(87) PCT Pub. No.: WO2018/088085
PCT Pub. Date: May 17, 2018

(65) Prior Publication Data
US 2019/0291752 A1 Sep. 26, 2019

(30) Foreign Application Priority Data
Nov. 14, 2016 (JP) .............................. JP2016-221199

(51) Int. Cl.
*H01L 21/677* (2006.01)
*B61B 3/02* (2006.01)
(Continued)

(52) U.S. Cl.
CPC .................. *B61B 3/02* (2013.01); *B65G 1/04* (2013.01); *B65G 9/002* (2013.01); *B65G 9/008* (2013.01);
(Continued)

(58) Field of Classification Search
CPC ...... B65G 1/0457; B65G 1/0464; B65G 1/04; B65G 9/002; B65G 9/008;
(Continued)

(56) References Cited

U.S. PATENT DOCUMENTS 6,050,768 A 4/2000 Iwasaki et al.
2006/0182553 A1* 8/2006 Yamamoto .............. B65G 47/61
414/278

(Continued)

FOREIGN PATENT DOCUMENTS

JP 06-321316 A 11/1994
JP 2006-113967 A 4/2006
(Continued)

OTHER PUBLICATIONS

Official Communication issued in International Patent Application No. PCT/JP2017/036443, dated Nov. 7, 2017.
(Continued)

*Primary Examiner* — Saul Rodriguez
*Assistant Examiner* — Brendan P Tighe
(74) *Attorney, Agent, or Firm* — Keating & Bennett, LLP

(57) ABSTRACT

Overhead transport vehicles with a hoist travel on a traveling rail for the overhead transport vehicles including a straight segment and a curved segment. A traveling rail for a local vehicle is provided below the traveling rail for the overhead transport vehicles, allows articles passing upward and downward over the traveling rail, has one end below the straight segment, extends from the one end parallelly to an extended line of the straight segment to a transfer position at the ground side, and has the other end outside an area under the straight segment. A buffer for the articles is provided below the straight segment and also below the traveling rail for the local vehicle. The local vehicle with a hoist traveling on the traveling rail for the local vehicle transfers the articles
(Continued)

between the transfer position at the ground side and the buffer.

7 Claims, 6 Drawing Sheets

(51) Int. Cl.
    *B65G 9/00*      (2006.01)
    *B65G 1/04*      (2006.01)

(52) U.S. Cl.
    CPC ...... *H01L 21/677* (2013.01); *H01L 21/67733* (2013.01); *B65G 2201/0297* (2013.01)

(58) Field of Classification Search
    CPC ...... B65G 2201/0297; H01L 21/67733; H01L 21/677; B61B 3/02
    See application file for complete search history.

(56) References Cited

U.S. PATENT DOCUMENTS

| | | |
|---|---|---|
| 2008/0063496 A1 | 3/2008 | Bufano et al. |
| 2009/0000505 A1* | 1/2009 | Shimamura ............. B61B 13/00 104/88.02 |
| 2010/0239400 A1* | 9/2010 | Ishikawa ........... H01L 21/67733 414/373 |
| 2011/0031091 A1 | 2/2011 | Fatula, Jr. et al. |
| 2012/0114453 A1* | 5/2012 | Ota .................. H01L 21/67724 414/281 |
| 2015/0332948 A1 | 11/2015 | Ikeda et al. |

FOREIGN PATENT DOCUMENTS

| | | |
|---|---|---|
| JP | 4296601 B2 | 7/2009 |
| JP | 2012-193033 A | 10/2012 |
| JP | 2012193033 A * | 10/2012 |
| JP | 2015-046646 A | 3/2015 |
| JP | 2016-113250 A | 6/2016 |

OTHER PUBLICATIONS

Official Communication issued in European Patent Application No. 17869050.9, dated May 14, 2020.

* cited by examiner

1

CEILING CONVEYANCE SYSTEM, AND RELAY CONVEYANCE APPARATUS AND CONVEYANCE METHOD USED THEREFOR

BACKGROUND OF THE INVENTION

1. Field of the Invention

The present invention relates to an overhead transport system, an intermediate transport apparatus therefor, and a transport method in a ceiling space.

2. Description of the Related Art

With respect to overhead transport systems, various layouts regarding the traveling rails for overhead transport vehicles and the arrangements of buffers have been considered for improving their transport and buffer capacities for the articles. For example, JP 4296601B discloses to provide a traveling rail for overhead transport vehicles in an intra-bay route within a clean room and to provide buffers under the traveling rail. A traveling rail for a local vehicle is further provided such that the traveling rail for the local vehicle is present outside of the traveling rail for the overhead transport vehicles and passes over the load ports of processing equipment. The local vehicle is provided with a lateral transfer mechanism for laterally moving a hoist so that articles may be transferred between the buffers and the load ports.

According to JP 4296601B, the overhead transport vehicles transfer articles between the buffers under the traveling rail for the overhead transport vehicles and the local vehicle transfers the articles between the buffers and the load ports. As a result, a large number of buffers may be provided and the articles may be transferred to and from the load ports by the local vehicle.

According to the system of JP 4296601B, there is a position where the overhead transport vehicles and the local vehicle may not transfer the articles. The overhead transport vehicles and the local vehicle may transfer the articles only between an area below straight segments of the traveling rails. Areas below curved segments of the traveling rails and so on, are the positions between which the overhead transport vehicles and the local vehicle may not transfer the articles. The positions are present outside the areas below the straight segments. Since, at these positions, load ports cannot be provided, the arrangement of processing equipment is restricted. If some load ports are provided at these positions, such load ports cannot be utilized to transfer articles into the processing equipment.

SUMMARY OF THE INVENTION

Preferred embodiments of the present invention provide an enlarged area to and from which an overhead transport system may transfer the articles. This enlarges the area in which processing equipment may be provided.

An overhead transport system according to a preferred embodiment of the present invention includes a traveling rail for overhead transport vehicles which includes at least a straight segment and at least a curved segment connected to the straight segment; and the overhead transport vehicles to travel on the traveling rail which is provided with a hoist to transfer articles. The overhead transport system further includes a traveling rail for a local vehicle, provided below the traveling rail for the overhead transport vehicles, allowing the articles to pass upward and downward, including one end below the straight segment, extending from the one end parallelly to an extended line of the straight segment to an area above a transfer position at a ground side, and including another end outside an area under the straight segment; at least a buffer to support the articles, provided below the straight segment and also below the traveling rail for the local vehicle; and at least one local vehicle, traveling on the traveling rail for the local vehicle, provided with a hoist, to transfer the articles between the transfer position at the ground side and the buffer.

A transport method according to a preferred embodiment of the present invention uses a traveling rail for overhead transport vehicles in a ceiling space, including at least a straight segment and at least a curved segment connected to the straight segment, and the overhead transport vehicles which travel on the traveling rail and including a hoist to transfer articles. The method uses at least a local vehicle including a hoist to transfer the articles and to travel on a traveling rail for the local vehicle, the traveling rail for the local vehicle being provided below the traveling rail for the overhead transport vehicles, allowing the articles to pass upward and downward, including one end below the straight segment, extending from the one end parallelly to an extended line of the straight segment to an area above a transfer position at a ground side, and including another end outside an area under the straight segment; and at least a buffer to support the articles, provided below the straight segment and also below the traveling rail for the local vehicle.

The method includes transferring the articles by the overhead transport vehicles in the straight segment between the buffer; and making the local vehicle transfer the articles between the buffer, travel on the traveling rail for the local vehicle, and transfer the articles between the transfer position at the ground side at a position outside the straight segment.

According to the overhead transport systems and the transport methods according to preferred embodiments of the present invention, the overhead transport vehicles traveling on the straight segment may transfer the articles between the buffer with the hoist such that the articles pass upward and downward over the traveling rail for the local vehicle. The local vehicle may transfer the articles with the hoist between the buffer and also may transfer the articles between the transfer position below the curved segment and the transfer position outside the area below the straight segment. By the way, between these transfer positions, the overhead transport vehicles may not directly transfer the articles. As a result, the overhead transport vehicles may transfer the articles between the transfer positions at the ground side, to which direct transfer by the overhead transport vehicles is impossible, via the buffer and the local vehicle. Thus, the area to and from which the overhead transport vehicles may transfer the articles is enlarged with this simple configuration. Hence, the area in which processing equipment may be provided is enlarged.

An intermediate transport apparatus according to a preferred embodiment of the present invention relays articles between overhead transport vehicles and a transfer position at a ground side. The overhead transport vehicles travel on a traveling rail having at least a straight segment and at least a curved segment connected to the straight segment and are provided with a hoist, and the straight segment is outside an area over the transfer position. The intermediate transport apparatus includes a traveling rail for a local vehicle, provided below the traveling rail for the overhead transport vehicles, allowing the articles to pass upward and downward, including one end below the straight segment, extending from the one end parallelly to an extended line of the straight segment to an area above the transfer position at the ground side, and including another end outside an area under the straight segment; at least a buffer to support the articles, provided below the straight segment and also below the traveling rail for the local vehicle; and at least one local vehicle, traveling on the traveling rail for the local vehicle, provided with a hoist, to transfer the articles between the transfer position at the ground side and the buffer.

According to the intermediate transport systems of preferred embodiments of the present invention, the overhead transport vehicles traveling on the straight segment may transfer the articles between the buffer with the hoist such that the articles pass upward and downward over the traveling rail for the local vehicle. The local vehicle may transfer the articles with the hoist between the buffer and also may transfer the articles between the transfer position below the curved segment and the transfer position outside the area below the straight segment. By the way, between these transfer positions, the overhead transport vehicles may not directly transfer the articles. As a result, the overhead transport vehicles may transfer the articles between the transfer positions at the ground side, to which direct transfer by the overhead transport vehicles is impossible, via the buffer and the local vehicle. Thus, the area to which the overhead transport vehicles may transfer is enlarged by this simple configuration.

In the specification, "below the straight segment" means an area below the straight segment in a vertical plane perpendicular to the traveling rail. Further, the overhead transport vehicles and the local vehicle may be or may not be provided with a mechanism to laterally transfer the hoist. The buffer may be a fixed buffer under the traveling rail for the local vehicle or may be a slidable buffer that is slidable from a position under the traveling rail along a direction in a horizontal plane perpendicular to the traveling rail.

When the overhead transport vehicles are not provided with the lateral transfer mechanism, "below the traveling rail for the overhead transport vehicles" means an area under the traveling rail therefor. Similarly, when the local vehicle is not provided with the lateral transfer mechanism, "below the traveling rail for the local vehicle" means an area under the traveling rail therefor. In this specification, the intermediate transport apparatus means an apparatus including the traveling rail for the local vehicle, the local vehicle, and other elements and equipment for the traveling rail, the local vehicle, and the other elements. When the intermediate transport apparatus is connected to a usual overhead transport system, the result is an overhead transport system according to a preferred embodiment of the invention.

Preferably, the one end is located under the straight segment, and the buffer is provided under the straight segment and also under the traveling rail for the local vehicle. This configuration allows the overhead transfer vehicles and the local vehicle, both without a lateral transfer apparatus, to transfer the articles between the buffer with the hoist.

Preferably, the traveling rail for the local vehicle passes over the transfer position at the ground side. This configuration allows the local vehicle without a lateral transfer apparatus to transfer the articles between the transfer position at the ground side with the hoist.

Further preferably, the traveling rail for the local vehicle is provided, except for an area under the straight segment, over the transfer position at the ground side. This configuration allows using the traveling rail for the local vehicle over its entire length for the intermediate transport between the transfer positions at the ground side and the overhead transport vehicles.

Preferably, the another end is located under the curved segment and over the transfer position at the ground side. This configuration allows providing the transfer position at the ground side under the curved segment.

Preferably, the buffer is structured to support a plurality of the articles and extends from the one end parallelly to the traveling rail for the local vehicle. This configuration increases the number of the articles which may be transferred between the transfer position at the ground side by the overhead transport vehicles, and therefore, makes the transfer of the articles between the transfer position and the overhead transport vehicles via the buffer and the local vehicles more rapid.

Preferably, the overhead transport system further includes an inter-bay route including a plurality of additional traveling rails for the overhead transport vehicles such that the overhead transport vehicles travel on the additional traveling rails in the same direction, and the straight segment is connected, via the curved segment, to at least one of the additional traveling rails.

When the throughput of a semiconductor factory and so on is increased, the layout of the traveling rail in an inter-bay route has sometimes been changed to a double track. In this case, there are occasions where transfer positions at the ground side become outside an area below a straight segment; for example, the positions become below a curved segment. The above construction allows the overhead transport vehicles to transfer the articles between the transfer positions at the ground side which is outside the area below the straight segment, without moving the transfer positions at the ground side.

Preferably, the overhead transport system further includes a second traveling rail for the overhead transport vehicles, passing over and being parallel to the straight segment, the buffer is slidable along a direction in a horizontal plane perpendicular to a lengthwise direction of the traveling rail for the local vehicle, and the overhead transport vehicles to travel on the second traveling rail are provided with a lateral transfer apparatus to transfer the hoist along a direction in a horizontal plane perpendicular to a traveling direction of the overhead transport vehicles and are configured to transfer the articles between the buffer.

When constructed as described above, the overhead transport vehicles traveling on the second traveling rail may transfer the articles with the hoist which has laterally been transferred by the lateral transfer apparatus along the perpendicular direction between the buffer which has been slid along the perpendicular direction to the traveling rail for the local vehicle. Therefore, the overhead transport vehicles traveling on the second traveling rail may transfer the articles between the transfer positions at the ground side which is outside the area below the straight segment, via the buffer and the local vehicle.

Preferably, the buffer is slidable along a direction in a horizontal plane perpendicular to a lengthwise direction of the traveling rail for the local vehicle, and the overhead transport system further includes a second traveling rail for overhead transport vehicles, passing over the buffer when laterally slid, and being parallel to the straight segment.

When constructed as described above, the overhead transport vehicles traveling on the second traveling rail may transfer the articles between the buffer which has been slid along the perpendicular direction to the traveling rail for the local vehicle. Therefore, the overhead transport vehicles traveling on the second traveling rail may transfer the articles between the transfer positions at the ground side which is outside the area below the straight segment, via the buffer and the local vehicle.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
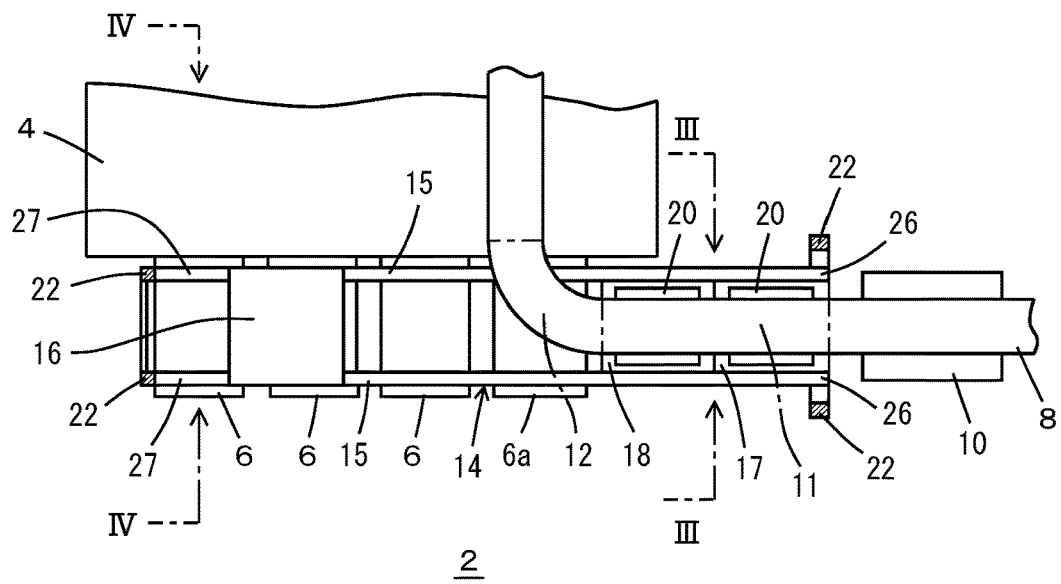
FIG. 1 is a plan view illustrating a major portion of an overhead transport system according to a preferred embodiment of the present invention and processing equipment.
Figure 2:
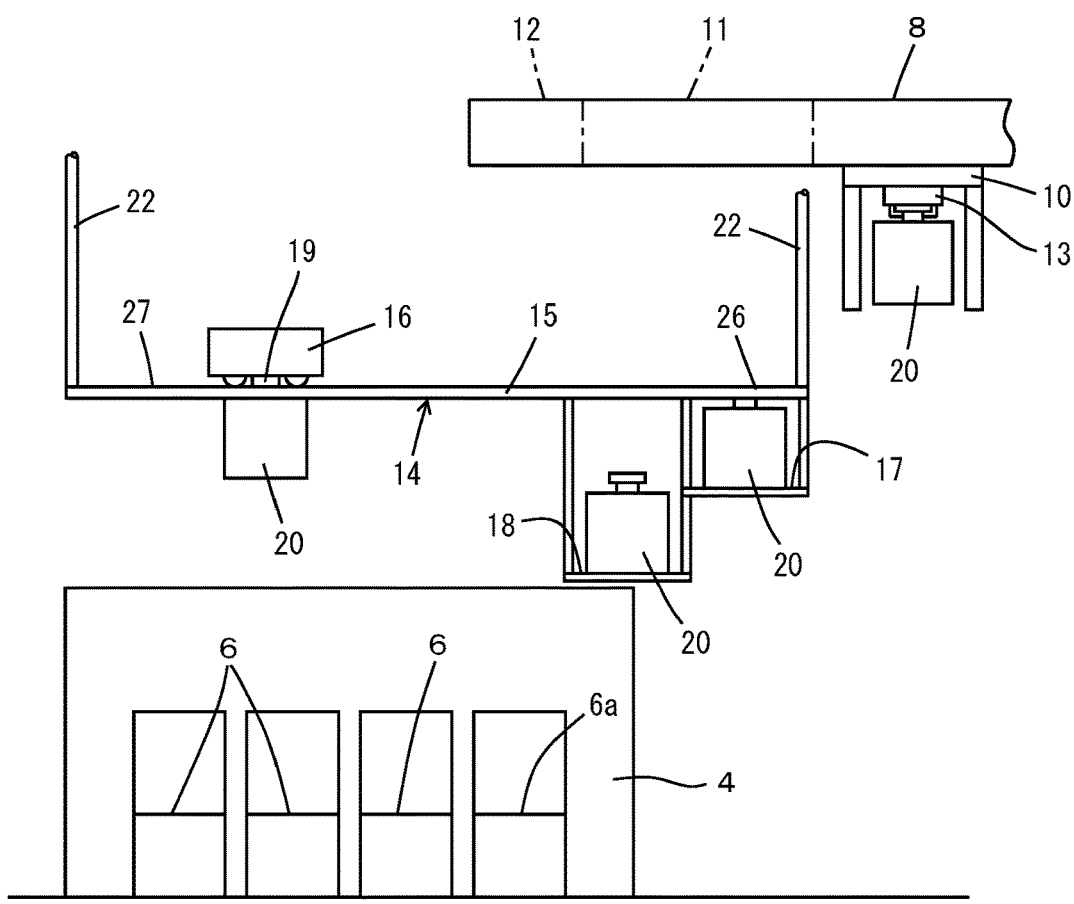
FIG. 2 is a side view illustrating a major portion of the overhead transport system according to a preferred embodiment of the present invention and processing equipment.
Figure 3:
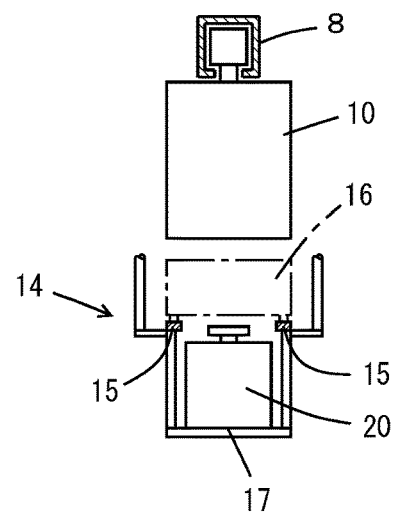
FIG. 3 is a vertical cross-sectional view along the iii-iii direction in FIG. 1.
Figure 4:
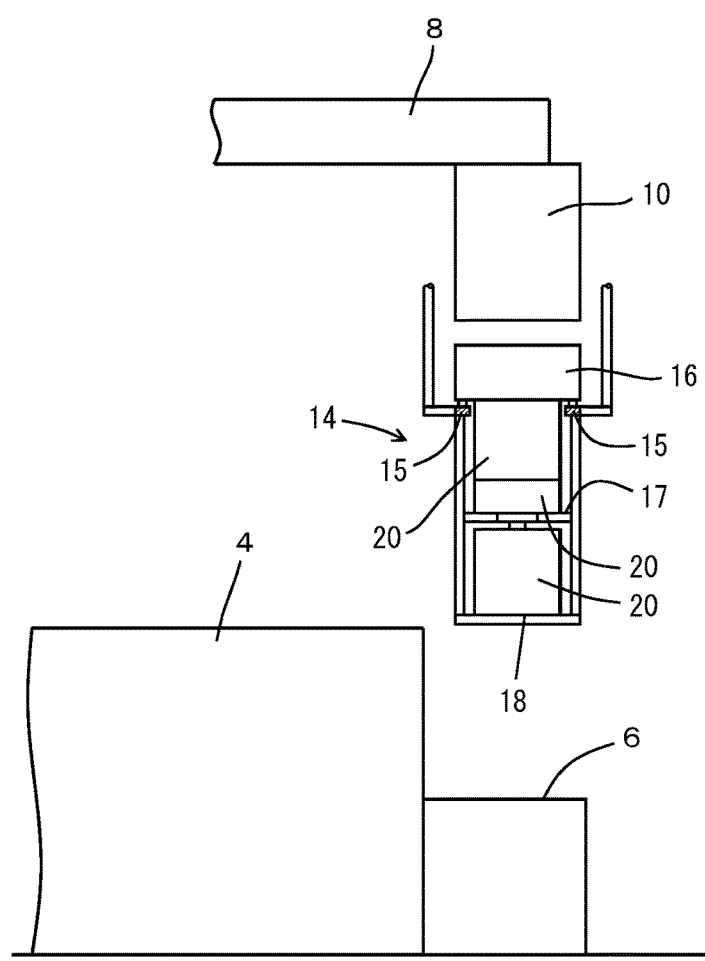
FIG. 4 is a vertical cross-sectional view along the iv-iv direction in FIG. 1.

Preferred embodiments of the present invention will be described. The scope of the present invention shall be construed based upon the claims, with reference to the description and well-known background art in the art, and according to the understanding of ordinary persons in the art.

FIGS. 1 to 8 show preferred embodiments and modifications of preferred embodiments of the present invention. FIGS. 1 to 4 show an overhead transport system 2 according to the present preferred embodiment. The processing equipment 4 such as those for semiconductor production is not a part of the overhead transport system 2. The load ports 6 of the processing equipment 4 are the transfer positions of articles 20 by the overhead transport system 2. The articles 20 are, for example, FOUPs, but the species of the articles 20 are arbitrary.

Overhead transport vehicles 10 travel on a traveling rail 8 in a ceiling space within a clean room, raise and lower the articles 20 by a hoist 13, and transfer the articles 20 between the load ports 6 and buffers 17, 18 which are to be described later. The traveling rail 8 includes straight segments and curved segments, and a first curved segment 12 is at the upstream or the downstream of a first straight segment 11 along the traveling direction.

An intermediate transport apparatus 14 relays the articles 20 between the overhead transport vehicles 10 and the load ports 6. A local vehicle 16 travels on, for example, a pair of traveling rails 15,15, and, for example, two buffers 17, 18 are provided under the first straight segment 11. The intermediate transport apparatus 14 includes the traveling rails 15, the local vehicle 16, the buffers 17, 18 and accompanying devices and the intermediate transport apparatus 14 is present below the traveling rail 8 for the overhead transport vehicles 10.

The traveling rails 15, 15 are straight in shape and are below the traveling rail 8 for the overhead transport vehicles 10. The gap between the traveling rails 15, 15 is larger than the size of the articles 20 along a direction in a horizontal plane perpendicular to the traveling direction on the traveling rails 15. The hoist 13 of the overhead transport vehicles 10 and a hoist 19 of the local vehicle 16 transfer the articles 20 through this gap between the buffers 17, 18 and the load ports 6. The traveling rails 15 may be a monorail.

The load ports 6 of the processing equipment 4 are under the traveling rails 15 for the local vehicle 16 and the load ports 6 are below an extended line of the first straight segment 11. Over the load ports 6, there is no straight segment of the traveling rail 8, and the load ports 6 are outside the positions suitable for the transfer of articles 20 by the overhead transport vehicles 8. Further, there are no buffers over the load ports 6. Another load port 6a is present below the curved segment 12. Since the articles 20 such as FOUPs have directionality and since they must be supported in a predetermined direction on the load ports 6, the overhead transport vehicles 10 cannot transfer the articles 20 to and from the load port 6a.

The buffers 17, 18 define and function as in-and-out ports for the intermediate transport apparatus 14, and the overhead transport vehicles 10 transfer the articles 20 to and from the intermediate transport apparatus 14 via the buffers 17, 18. For example, the buffer 17 defines and functions as the in-port and the buffer 18 defines and functions as the out-port.

The traveling rails 15 include one end 26 under the first straight segment 11 and the other end 27. While the number of the buffers 17, 18 is arbitrary, plural buffers are preferable for the rapid transfer of the articles to and from the load ports 6, 6a. Preferably, the buffer 17 at the one end 26 has a higher position than that the buffer 18 at the side of the load port 6a has. The heights of the buffers 17, 18 are determined such that the local vehicle 16 supporting an article 20 may pass over the buffer 18 having an article 20 and that it may not pass over the buffer 17 having an article 20. This configuration makes the raising and lowering distance shorter for the transfer of the articles 20 to and from the buffer 17 at the one end. The buffers 17, 18 may have a common height or three or more such buffers may be provided.

The supports 22 for the intermediate transport apparatus 14 support the intermediate transport apparatus 14 from the ceiling side of the clean room or from the ground side. Further, the traveling rail 8 for the overhead transport vehicles 10 are supported by unshown supports extending from the ceiling side.

The present preferred embodiment illustrated in FIGS. 1-4 has the following advantageous merits. While the overhead transport vehicles 10 cannot directly transfer the articles 20 to and from the load ports 6, 6a, the overhead transport vehicles 10 may transfer the articles 20 via the intermediate transport apparatus 14. Therefore, the processing equipment 4 may be provided in a wider area within the clean room.

Figure 5:
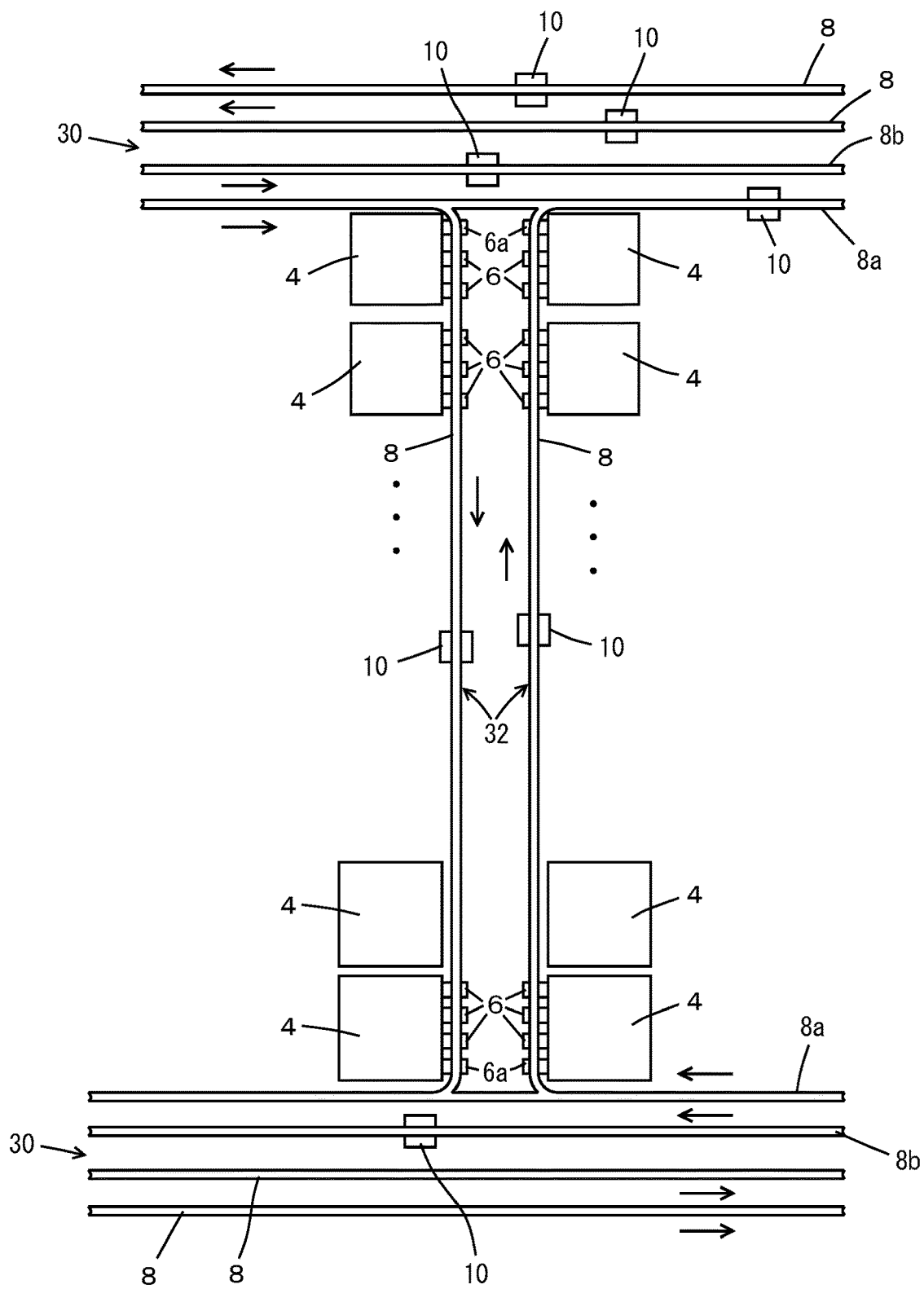
FIG. 5 is a plan view illustrating the layout of an overhead transport system and processing equipment according to a modification of a preferred embodiment of the present invention.
Figure 6:
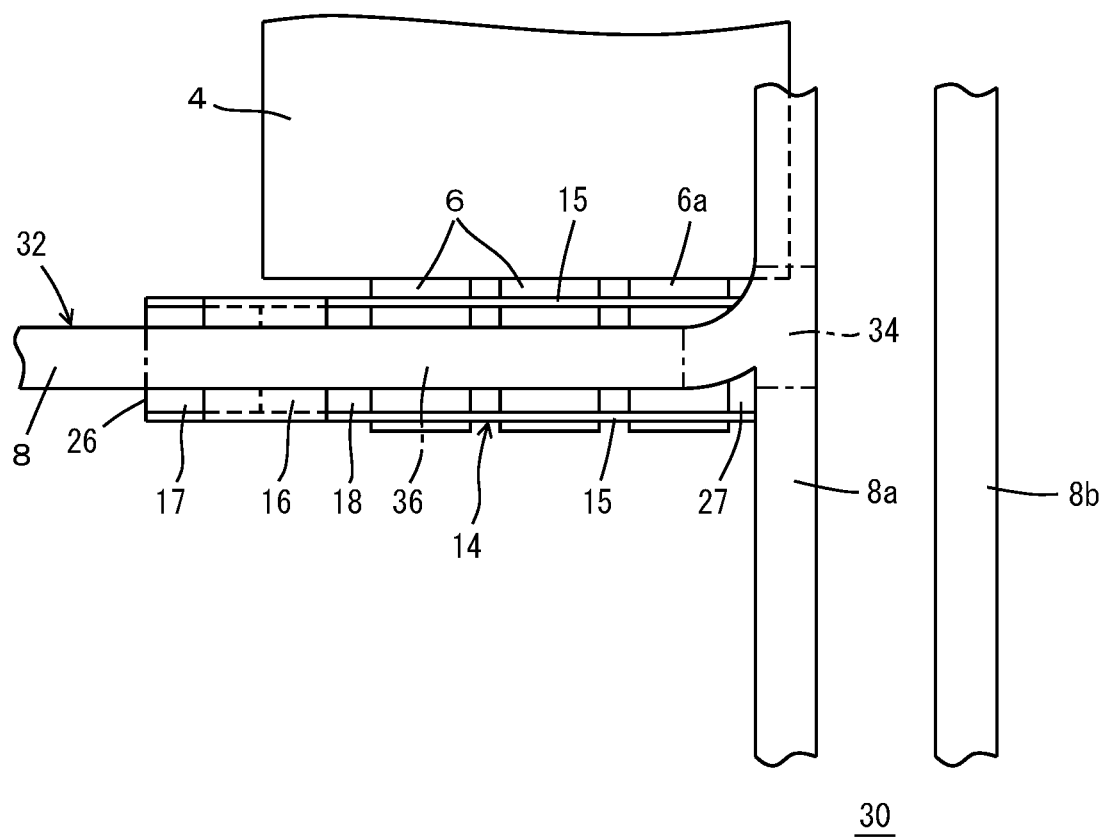
FIG. 6 is a partially enlarged plan view of the modification of a preferred embodiment of the present invention.

FIGS. 5 and 6 illustrate a modification of a preferred embodiment of the present invention and the modification is the same as the preferred embodiment in FIGS. 1-4 unless otherwise specified. Denoted by 30 is an inter-bay route, and denoted by 32 is an intra-bay route; the arrows in FIG. 5 indicate the traveling direction of the overhead transport vehicles 10. The inter-bay route 30 is provided with two parallel traveling rails 8, 8; the overhead transport vehicles 10 travel on the traveling rails in the same direction. Further, a traveling rail 8a of the inter-bay route is connected with a traveling rail 8 in the intra-bay route 32, but a traveling rail 8b of the inter-bay route is not connected with the traveling rail 8 in the intra-bay route 32. Along the intra-bay route 32, the processing equipment 4 and their load ports 6 are provided.

FIG. 5 is an enlarged view of the connection portion between the inter-bay route 30 and the intra-bay route 32. In the connection portion between them, is a branching segment 34 or a merging segment. The branching segment 34 and the merging segment are curved segments and correspond to the first curved segment. The overhead transport vehicles cannot transfer the articles to and from a load port 6a below the curved segment. For example, in FIG. 6, to and from the right end load port 6a among the three load ports 6 of the processing equipment 4, the overhead transport vehicles cannot transfer the articles. This reduces the processing capacity of the processing equipment 4 remarkably due to the transfer delay of the articles.

A straight segment 36 in the intra-bay route 32, following the branching segment 34, corresponds to the first straight segment. The traveling rails 15, 15 for the local vehicle 16 are provided within the range from the one end 26 under the straight segment 36 to the other end 27 under the branching segment 34 or the merging segment. This configuration allows the overhead transport vehicle to transfer the articles to and from the load port 6a via the buffers 17, 18. Further, the buffers 17, 18 serve also for other load ports 6 as buffers. Thus, on a given arrangement of the traveling rail 8a, the area for the processing equipment 4 is enlarged. On the other hand, on a given arrangement of the processing equipment 4, the area for the traveling rail 8a is enlarged.

Figure 7:
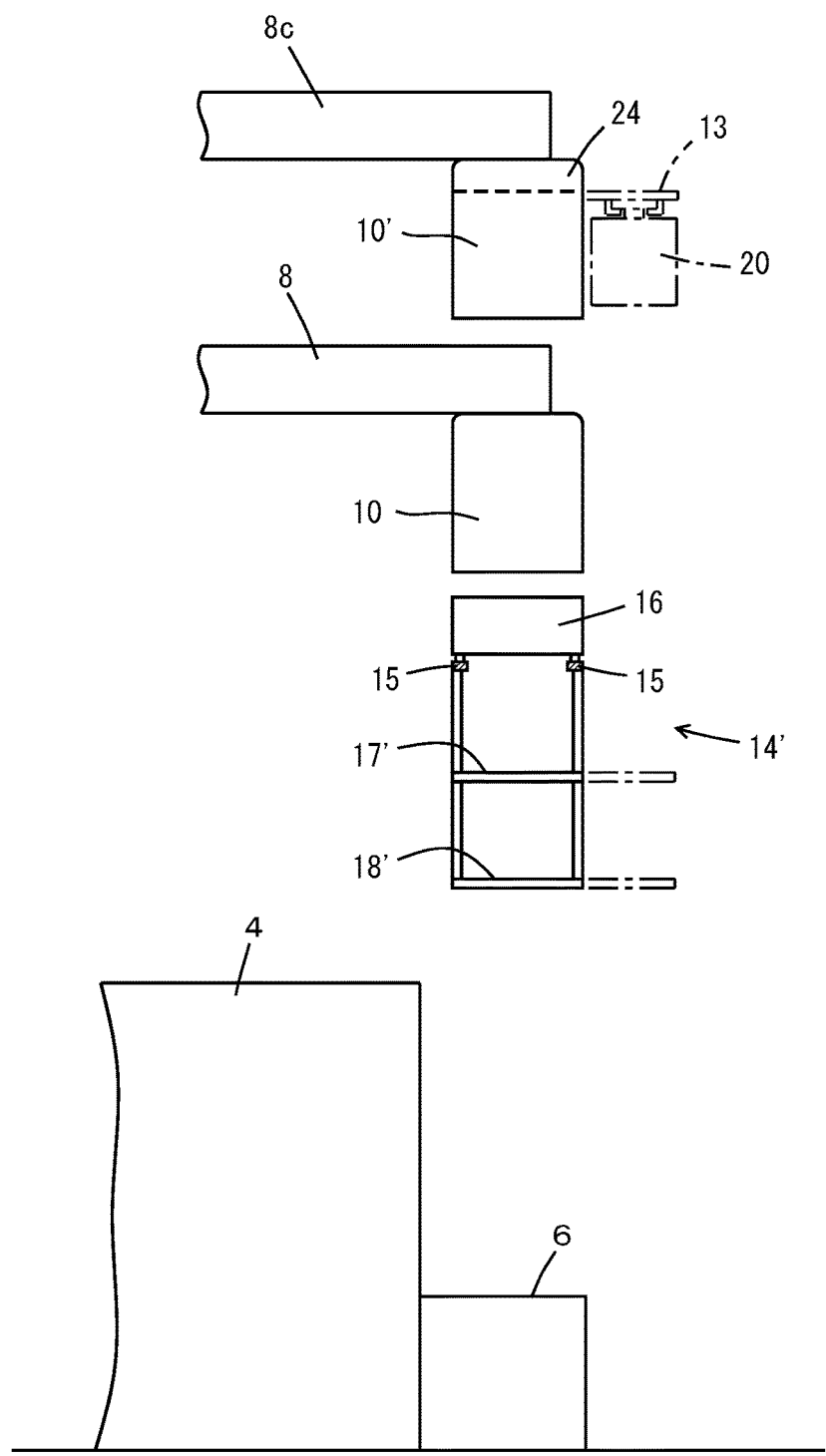
FIG. 7 is a vertical cross-sectional view illustrating an overhead transport system and processing equipment according to a second modification of a preferred embodiment of the present invention.

FIG. 7 illustrates a second modification of a preferred embodiment of the present invention. At least the upper and the lower two traveling rails e.g. the lower traveling rail 8 and the upper traveling rail 8c, are provided for the overhead transport vehicles. The overhead transport vehicles 10 traveling on the lower traveling rail 8 are, for example, the same with the overhead transport vehicles 10 shown in FIGS. 1-6. The overhead transport vehicles 10' traveling on the upper traveling rail 8c are provided with a lateral transfer apparatus 24 to move the hoist 13 laterally along the direction in a horizontal plane perpendicular to the traveling direction of the overhead transport vehicles 10'. An intermediate transport apparatus 14' is provided with slidable buffers 17', 18' that advance and retract, along the direction in a horizontal plane perpendicular to the lengthwise direction (the traveling direction) of the traveling rails 15 for the local vehicles 10, between positions advancing beyond the traveling rail and positions under the traveling rail. A state where the hoist 13 has been moved laterally by the lateral transfer apparatus 24 of the overhead transport vehicles 10' and the slidable buffers 17', 18' have advanced is shown by dash one-dotted lines.

The overhead transport vehicles 10' traveling on the traveling rail 8c may transfer the articles 20 to and from the advanced slidable buffers 17', 18'. And the overhead transport vehicles 10 traveling on the traveling rail 8 and the local vehicle 16 may transfer the articles 20 to and from the retracted slidable buffers 17', 18'. Further, the local vehicle 16 transfers the articles 20 to and from the load ports 6. Since the lower and upper traveling rails 8, 8c for the overhead transport vehicles 10, 10' are arranged in the same space, the transport capacity of the articles 20 is improved. Further, the intermediate transport apparatus 14' enlarges the area where the processing equipment 4 may be provided.

Figure 8:
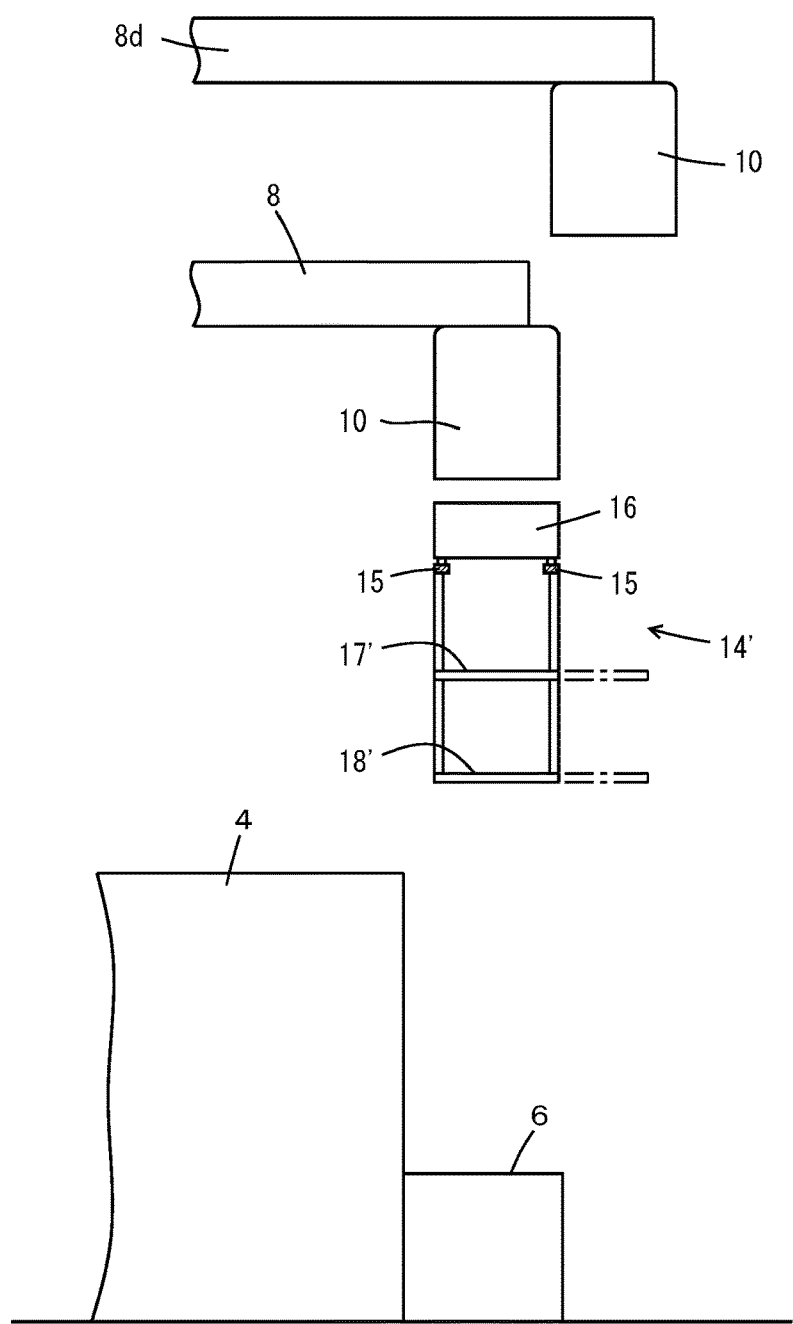
FIG. 8 is a vertical cross-sectional view illustrating an overhead transport system and processing equipment according to a third modification of a preferred embodiment of the present invention.

The modification shown in FIG. 7 may be further altered to a modification of a preferred embodiment of the present invention in FIG. 8. A traveling rail 8d is provided, instead of the traveling rail 8c, and the traveling rail 8d includes a straight segment over the advanced slidable buffers 17', 18'. The overhead transport vehicles 10 without the lateral transfer apparatus 24 travel on the traveling rail 8d. The overhead transport vehicles 10 transfer the articles to and from the advanced slidable buffer 17', 18', and the local vehicle 16 transfers the articles to and from the retracted slidable buffer 17', 18' and the load ports 6.

The preferred embodiments and the modifications thereof have the following advantageous merits. According to the preferred embodiments and each of the modifications in FIGS. 1-8, the overhead transport vehicles 10 in the straight segments 11, 36 may transfer the articles 20 to and from the buffers 17, 18 by the hoist 13 through the traveling rails 15 for the local vehicle. The local vehicle 16 may transfer the articles 20 to and from the buffers 17, 18 by the hoist 19. Further, the local vehicle 16 may transfer the articles 20 to and from the transfer positions (load port 6a) below the curved segments (the curved segment 12, the branching segment 34, and so on) and also to and from the transfer positions (load port 6) outside an area below the straight segments 11, 36. To and from these transfer positions, the overhead transport vehicles 10 may not directly transfer the articles 20. Hence, the overhead transport vehicles 10 may transfer the articles 20 to and from those transfer positions, for which direct transfer of articles 20 is not possible, via the buffers 17, 18 and the local vehicle 16. Thus, by these simple configurations, the area suitable for the transfer of articles transport is enlarged.

The buffers 17, 18 are provided from the one end along the traveling rails for the local vehicle so that plural articles may be supported thereon. Therefore, a larger number of articles 20 may be transferred between the overhead transport vehicles 10 and the buffers 17, 18. Thus, the articles 20 may be transferred more rapidly between the transfer positions (load ports 6) and the overhead transport vehicle 10 via the buffers 17, 18 and the local vehicle 16.

To increase the throughput in a semiconductor factory and so on, the layout for the inter-bay route 30 may be changed to a double track including two traveling rails 8a, 8b. In this case, the transfer position 6a may become below the curved segment 34 and outside the area below the straight segment 36. In the modification in FIGS. 5, 6, the overhead transport vehicles 10 may transfer the articles 20 to and from those transfer positions outside the area below the straight segment 36, without rearranging the transfer positions (the load port 6a) for the articles 20, in this case.

According to the modification in FIG. 7, the hoist 13 is laterally transferred by the lateral transfer apparatus 24 along the direction in a horizontal plane perpendicular to the straight segment of the traveling rail 8c. At the same time, the slidable buffers 17', 18' are moved along the direction in a horizontal plane perpendicular to the traveling rails 15 for the local vehicle. Then, the articles 20 are transferred between the moved hoist 13 and the moved slidable buffers 17', 18'. Thus, the overhead transport vehicles 10' traveling on the second traveling rail 8c may transfer the articles to and from the transfer positions (load ports 6) that are outside the area below the straight segment, via the slidable buffers 17', 18' and the local vehicle 16.

According to the modification in FIG. 8, the overhead transport vehicles 10 traveling on the second traveling rail (the traveling rail 8d) may transfer the articles 20 to and from the slidable buffers 17', 18' that have been laterally transferred along the direction in a horizontal plane perpendicular to the traveling rails 15 for the local vehicle. Thus, the overhead transport vehicles 10 on the second traveling rail may transfer the articles 20 to and from the transfer positions (load ports 6) that are outside the area below the straight segment, via the slidable buffers 17', 18' and the local vehicle 16.

Various buffers and stockers, other than the buffers 17, 18 in the preferred embodiments, have been provided in overhead transport systems. These known apparatuses may be added in the systems according to the preferred embodiments and modifications thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport system comprising:
    a first traveling rail on which overhead transport vehicles that include a first hoist to transfer articles to and from a first buffer and a second buffer travel, the first traveling rail including at least a straight segment and at least a curved segment connected to the straight segment;
    a second traveling rail for a local vehicle, provided below the first traveling rail, allowing the articles to pass upward and downward, including one end under the straight segment, extending straightly from the one end parallelly to an extended line of the straight segment, passing over a transfer position at a ground side, and further extending straightly to another end outside an area under the straight segment;
    the first and second buffers to support the articles, provided under the straight segment and also under the second traveling rail; and
    the local vehicle, traveling on the second traveling rail, and provided with a second hoist to transfer the articles between the transfer position at the ground side and the first and second buffers; wherein
    the first and second buffers are slidable along a direction in a horizontal plane perpendicular to a lengthwise direction of the traveling rail for the local vehicle;
    the overhead transport system further includes another first traveling rail for the overhead transport vehicles, the another first traveling rail being provided over the straight segment and being parallel to the straight segment;
    the overhead transport vehicles to travel on the another first traveling rail are provided with a lateral transfer apparatus to transfer the first hoist along a direction in a horizontal plane perpendicular to a traveling direction of the overhead transport vehicles and are structured to transfer the articles to and from the first and second buffers; and
    the first buffer is located at a higher position than the second buffer.

2. The overhead transport system according to claim 1, wherein the second traveling rail is provided over the transfer position at the ground side except for an area under the straight segment.

3. The overhead transport system according to claim 1, wherein the another end is located under the curved segment and over the transfer position at the ground side.

4. The overhead transport system according to claim 1, wherein the first and second buffers are structured to support a plurality of the articles and extend from the one end parallelly to and under the traveling rail for the local vehicle.

5. The overhead transport system according to claim 1, further comprising an inter-bay route including a plurality of additional traveling rails for the overhead transport vehicles such that the overhead transport vehicles travel on the additional traveling rails in a same direction; wherein
    the straight segment is connected, via the curved segment, to at least one of the additional traveling rails.

6. An overhead transport system comprising:
    a first traveling rail on which overhead transport vehicles that include a first hoist to transfer articles to and from a first buffer and a second buffer travel, the first traveling rail including at least a straight segment and at least a curved segment connected to the straight segment;
    a second traveling rail for a local vehicle, provided below the first traveling rail, allowing the articles to pass upward and downward, including one end under the straight segment, extending straightly from the one end parallelly to an extended line of the straight segment, passing over a transfer position at a ground side, and further extending straightly to another end outside an area under the straight segment;
    the first and second buffers to support the articles, provided under the straight segment and also under the second traveling rail; and
    the local vehicle, traveling on the second traveling rail, and provided with a second hoist to transfer the articles between the transfer position at the ground side and the first and second buffers; wherein
    the first and second buffers are slidable along a direction in a horizontal plane perpendicular to a lengthwise direction of the second traveling rail; and
    the overhead transport system further comprises another first traveling rail for overhead transport vehicles, passing over the first and second buffers when laterally slid, and being parallel to the straight segment; and
    the first buffer is located at a higher position than the second buffer.

7. A transport method using a first traveling rail for overhead transport vehicles including at least a straight segment and at least a curved segment connected to the straight segment, and the overhead transport vehicles traveling on the first traveling rail and including a first hoist to transfer articles to and from a first buffer and a second buffer, the method using:
    a local vehicle including a second hoist to transfer the articles between a transfer position at a ground side and the first and second buffers, and to travel on a second traveling rail for the local vehicle, the second traveling rail being provided below the first traveling rail, allowing the articles to pass upward and downward, including one end under the straight segment, extending straightly from the one end parallelly to an extended line of the straight segment, passing over the transfer position at the ground side, and further extending straightly to another end outside an area under the straight segment; and
    the first and second buffers to support the articles, provided under the straight segment and also under the second traveling rail; and the method comprising:

transferring the articles by the overhead transport vehicles in the straight segment between the buffer; and making the local vehicle transfer the articles to and from the first and second buffer, travel on the second traveling rail, and transfer the articles between the transfer position at the ground side at a position outside the straight segment; wherein the first and second buffers are slidable along a direction in a horizontal plane perpendicular to a lengthwise direction of the traveling rail for the local vehicle;

the overhead transport system further includes another first traveling rail for the overhead transport vehicles, the another first traveling rail being provided over the straight segment and being parallel to the straight segment;

the overhead transport vehicles to travel on the another first traveling rail are provided with a lateral transfer apparatus to transfer the first hoist along a direction in a horizontal plane perpendicular to a traveling direction of the overhead transport vehicles and are structured to transfer the articles to and from the first and second buffers; and the first buffer is located at a higher position than the second buffer.

* * * * *